(12) United States Patent
Chua et al.

(10) Patent No.: US 7,723,719 B2
(45) Date of Patent: May 25, 2010

(54) LIGHT EMITTING DEVICES WITH INHOMOGENEOUS QUANTUM WELL ACTIVE REGIONS

(75) Inventors: Christopher L. Chua, San Jose, CA (US); Zhihong Yang, Sunnyvale, CA (US); John E. Northrup, Palo Alto, CA (US); Noble Marshall Johnson, Menlo Park, CA (US)

(73) Assignee: Palo Alto Research Center Incorporated, Palo Alto, CA (US)

( * ) Notice: Subject to any disclaimer, the term of this patent is extended or adjusted under 35 U.S.C. 154(b) by 60 days.

(21) Appl. No.: 11/957,247

(22) Filed: Dec. 14, 2007

(65) Prior Publication Data
US 2009/0152529 A1     Jun. 18, 2009

(51) Int. Cl.
*H01L 29/15*     (2006.01)
*H01L 31/00*     (2006.01)

(52) U.S. Cl. ............................ 257/15; 257/17; 257/595; 257/E29.072
(58) Field of Classification Search .................. 257/15, 257/79, 88, 89, 90
See application file for complete search history.

(56) References Cited

U.S. PATENT DOCUMENTS

| | | | |
|---|---|---|---|
| 2002/0074542 A1* | 6/2002 | Gunapala et al. | 257/14 |
| 2005/0067627 A1* | 3/2005 | Shen et al. | 257/89 |
| 2005/0224781 A1* | 10/2005 | Kneissl et al. | 257/14 |
| 2006/0108528 A1* | 5/2006 | Qiu | 250/338.4 |

* cited by examiner

*Primary Examiner*—Fernando L Toledo
*Assistant Examiner*—Mamadou Diallo
(74) *Attorney, Agent, or Firm*—Marger Johnson & McCollom, P.C.

(57) ABSTRACT

A method of fabricating a light emitting device includes modulating a crystal growth parameter to grow a quantum well layer that is inhomogeneous and that has a non-random composition fluctuation across the quantum well layer.

19 Claims, 5 Drawing Sheets

LIGHT EMITTING DEVICES WITH INHOMOGENEOUS QUANTUM WELL ACTIVE REGIONS

BACKGROUND

Semiconductor light-emitting devices such as Light-Emitting Diodes (LEDs) and laser diodes typically utilize an active layer, where electrons and holes combine to emit light. Table 1, which is presented below, describes the epitaxial layer structure of an LED that emits light at a wavelength of 345 nm. The structure utilizes multiple quantum well active layers with homogeneous composition. In Table 1, the layers are numbered in order from 1 to 426, with 1 being the top most layer and 426 the layer closest to the substrate. In order to save space, in situations where a specific sequence of layers is merely repeated a number of times, the number of times that the original sequence repeats is indicated in the "repetition" column of Table 1. For example, although layers 4-43 are not specified, the sequence of layers 2 and 3 is repeated 20 times. Thus, all even layers between 2 and 44 (layers 4, 6, 8, 10, ..., 38, 40, 42) are the same as layer 2, while all odd layers between 3 and 45 (5, 7, 9, ..., 39, 41, 43) are the same as layer 3.

The "composition" column of Table 1 is self-explanatory, as is the "thickness" column. Some layers are indicated as having a dopant, for example, layer 2 ($Al_{0.30}Ga_{0.70}N$: Si) is doped with silicon. The "comments" column of Table 1 provides additional descriptive information about the layer or group of layers. For example, layers 49 and 53 are the quantum well layers and have a relatively low band gap, while layers 46-48, 50-52, and 54-56 serve as the barriers and have a relatively high band gap compared to the quantum well layers.

TABLE 1

| Layer | Composition | Thickness (nm) | Repetition | Comments |
|---|---|---|---|---|
| 1 | GaN:Mg | 20 | | p-contact |
| 2 | $Al_{.30}Ga_{.70}N$:Si | 3.06 | 20 | p-cladding, |
| 3 | $Al_{.28}Ga_{.72}N$:Si | 3.82 | | 144.48 nm total |
| 44 | $Al_{.26}Ga_{.74}N$:Mg | 66.96 | | p-waveguide |
| 45 | $Al_{.48}Ga_{.52}N$:Mg | 21.88 | | tunnel barrier layer |
| 46 | $In_xAl_{(.18-x)}Ga_{.82}N$ | 4.06 | | barrier |
| 47 | $In_xAl_{(.18-x)}Ga_{.82}N$:Si | 2.32 | | |
| 48 | $In_xAl_{(.18-x)}Ga_{.82}N$ | 4.06 | | |
| 49 | $In_xAl_{(.15-x)}Ga_{.85}N$ | 5.25 | | quantum well |
| 50 | $In_xAl_{(.18-x)}Ga_{.82}N$ | 4.06 | | barrier |
| 51 | $In_xAl_{(.18-x)}Ga_{.82}N$:Si | 2.32 | | |
| 52 | $In_xAl_{(.18-x)}Ga_{.82}N$ | 4.06 | | |
| 53 | $In_xAl_{(.15-x)}Ga_{.85}N$ | 5.25 | | quantum well |
| 54 | $In_xAl_{(.18-x)}Ga_{.82}N$ | 4.06 | | barrier |
| 55 | $In_xAl_{(.18-x)}Ga_{.82}N$:Si | 2.32 | | |
| 56 | $In_xAl_{(.18-x)}Ga_{.82}N$ | 4.06 | | |
| 57 | $In_xAl_{(.26-x)}Ga_{.74}N$:Si | 70.56 | | n-waveguide |
| 58 | $Al_{.28}Ga_{.72}N$:Si | 3.16 | 100 | n-cladding, |
| 59 | $Al_{.30}Ga_{.70}N$:Si | 2.33 | | 555.22 nm total |
| 260 | $Al_{.30}Ga_{.70}N$:Si | 0.728 | | |
| 261 | $Al_{.31}Ga_{.69}N$:Si | 1198.35 | | n-contact layer |
| 262 | $Al_{.31}Ga_{.69}N$ | 159.78 | | interface layer to low Al |
| 263 | GaN | 0.25 | 40 | strain relief layer |
| 264 | AlN | 0.38 | | |
| 345 | GaN | 0.25 | 39 | |
| 346 | AlN | 1.0 | | |
| 425 | AlN | 28.8 | | surface conditioning layer |
| 426 | $Al_{.83}Ga_{.27}N$ | 1200 | | AlGaN template |
| | Sapphire substrate | | | |

The active region of the 345 nm LED described above in Table 1 are layers 46-56. These layers include three barrier layers and two 5.25 nm-thick quantum wells composed of $In_xAl_{(0.15-x)}Ga_{0.85}N$ with x—the indium component—nominally at 1%.

Table 2, which is presented below, summarizes the Metal Organic Chemical Vapor Deposition (MOCVD) gas flow conditions for each of the quantum wells (layers 49 and 53) of Table 1. A constant flow rate of 0.9 cc/min of tri-methyl gallium (TMG), 0.4 cc/min of tri-methyl aluminum (TMA), and 80 cc/min of tri-methyl indium (TMI) is employed during the 120 second growth time of each quantum well.

TABLE 2

| Time (sec) | TMG (cc/min) | TMA (cc/min) | TMI (cc/min) |
|---|---|---|---|
| 0-120 | 0.9 | 0.4 | 80 |

Most light-emitting semiconductor devices such as LEDs and laser diodes employ quantum wells with uniform material compositions, such as the quantum wells described above in Table 1. Thus, conventional quantum well designs employ very uniform material and require the crystal grower to go to great lengths to ensure that the quantum well material is as homogeneous as possible.

While such active layers are well suited for many applications, they may not be optimal for some material systems, including those necessary for accessing the green and deep UltraViolet (UV) wavelength regions. The green wavelength region may be considered to be from about 470 nanometers (nm) to about 550 nm, while the deep UV wavelength region may be considered to be from about 200 nm to about 365 nm. For example, with $In_xGa_{1-x}N$, the high In component needed to attain a bandgap for green emission usually leads to uncontrollable segregation of InN or GaN during material growth. For the deep UV wavelength range, it becomes increasingly difficult to grow high quality quantum wells with the high Al-containing AlGaN. Example embodiments address these and other disadvantages of the conventional art.

FIG. 1 is a graph 100 illustrating the L-I (light vs. current) characteristics of 300 μm×300 μm deep UV LEDs that employs conventional quantum well active layers having uniform material composition. FIG. 2 is a graph 200 illustrating the L-I characteristics of 200 μm×200 μm deep UV LEDs that employ conventional quantum well active layers having uniform material composition. Graphs 100 and 200 are referenced in the description of the example embodiments below for comparison purposes.

DETAILED DESCRIPTION OF THE EMBODIMENTS

Figure 1:
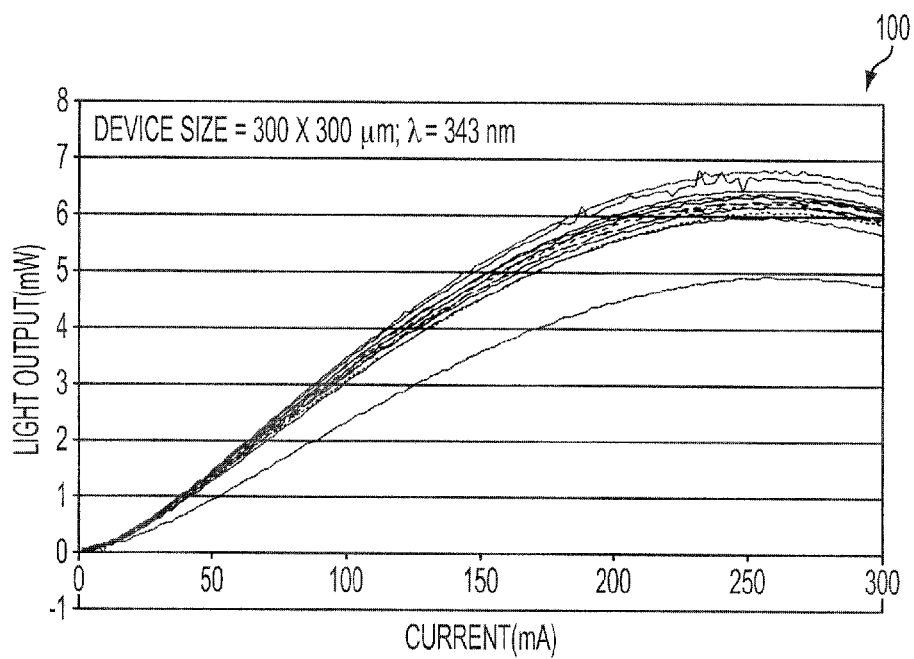
FIG. 1 is a graph illustrating the L-I characteristics of 300 μm×300 μm deep UV LEDs that employ conventional quantum well active layers having uniform material composition.

In one form of the presently described embodiments, an inhomogeneous quantum well design is disclosed whereby the material composition of the quantum well is controllably altered during material growth. According to some embodiments, during MOCVD, the concentration of one or more metal organic source gases is modulated during crystal growth. According to other embodiments, other crystal growth techniques such as Molecular Beam Epitaxy (MBE) or Chemical Beam Epitaxy (CBE) may be used whereby one or more parameters such as temperature, pressure, or gas flow rates are varied by design during crystal growth.

While embodiments may employ different inhomogeneous quantum well designs, in some embodiments the composition fluctuation of the quantum well is made periodic. For purposes of this disclosure, such a quantum well design will be referred to as a short period superlattice quantum well, or superlattice. The superlattice design allows deposition of thin alternating layers of different materials to achieve an average overall alloy composition, making it useful in cases where direct growth of a desired material alloy is difficult. For example, alternating layers of thin binary InN and GaN may be deposited to achieve an InGaN region having a desired average In content.

In some embodiments, the superlattice design may be employed for each quantum well within a multiple quantum well active layer. According to some embodiments, certain sections of the superlattice can also be doped with impurities to lower device resistance or to counter built-in polarization fields. Other advantages of example embodiments will be apparent in the description that follows.

One particular example of an inhomogeneous active region in InGaN is a superlattice design where the In concentration is controllably altered from layer to layer. Within such an active region the wave function for the electrons and holes will have more weight on the In-rich regions and relatively less on the Ga-rich regions. The effective band gap will therefore be lower in such an inhomogeneous active region in comparison to a homogeneous active region that has the same average In and Ga compositions. The lattice mismatch is largely determined by the average compositions in the quantum well region and the barrier region. The barrier region can be grown with a homogeneous In(Ga) composition. Therefore, by forming an inhomogeneous quantum well region, and a homogeneous barrier region, one can achieve a larger band offset with the same lattice mismatch than is possible if the quantum well region is homogeneous. This will improve the performance of the emitter.

A specific example is a green emitter with an active region having an average In composition of 30% and a barrier region with an average In composition of 15%. If both barrier and active regions had homogeneous In compositions then the difference in energy band gaps would be about 0.5 eV. However, if the active region is grown with a variable In composition, then the difference in band gaps is larger because of a redshift in the inhomogeneous active region, but the lattice mismatch will be unchanged. In this context, "redshift" refers to the inhomogeneous active layer having an effective bandgap that is smaller than the bandgap of a similar active layer that has the same average composition as that of the inhomogeneous active layer. This redshift, or lower effective bandgap in the active layer, allows a larger effective band offset (difference in bandgaps) between the active layer and the barrier than what can be attained from a homogenous active layer.

According to example embodiments, the growth of the active region may be performed by varying the In and Ga flow rates during MOCVD. In other example embodiments, the growth of the active region may be performed by alteration of the temperatures of the elemental In and Ga sources during MBE.

To demonstrate the concepts described above, the inventors have grown, fabricated, and characterized deep UV LEDs operating at the 345 nm wavelength range. Devices utilizing conventional quantum wells with homogeneous active regions, such as the LED of Table 1, were compared with those where the active regions were replaced with inhomogeneous superlattice structures in accordance with example embodiments.

In one superlattice quantum well design according to an example embodiment, the conventional growth sequence for the quantum well layers shown in Table 2 was modified by breaking up the original 120 second growth time into five 20-second periods plus two 10-second periods. The gas flow rates for MOCVD are controlled during the five 20-second periods such that a fluctuation of the gas flow rates is achieved over a total of 100 seconds. One of the 10-second periods immediately precedes the five 20-second periods, while the other one of the 10-second periods immediately follows the five 20-second periods. During the 10-second periods, the gas flow remains constant. Table 3, which is presented below, illustrates the MOCVD gas flow conditions for the example superlattice design described above.

TABLE 3

| Time (sec) | TMG (cc/min) | TMA (cc/min) | TMI (cc/min) | Repetition |
|---|---|---|---|---|
| 0-10 | 0.9 | 0.4 | 80 | |
| 10-20 | 1.8 | 0 | 80 | 4 |
| 20-30 | 0 | 0.8 | 80 | |
| 110-120 | 0.9 | 0.4 | 80 | |

Table 3 illustrates a five-period superlattice, because the 20 second period between 10 and 30 seconds is repeated four additional times. The total number of seconds for the gas flow conditions of Table 3 is the same as for the conventional gas flow conditions illustrated in Table 2. During the first and last ten seconds of Table 3, the gas flow conditions are the same as Table 2. The superlattice structure is established over the 100 seconds between 10 and 110 seconds.

As illustrated in Table 3, during each 20 second period when the superlattice structure is established, the TMG flows at 1.8 cc/min for the first ten seconds, and then at zero cc/min for the next ten seconds. On the other hand, the TMA flow is zero cc/min for the first ten seconds, but 0.8 cc/min for the next ten seconds. The TMI remains at a constant flow throughout the 120 second process. The section with 1.8 cc/min TMG and 0 cc/min TMA would result in a gallium-rich film relative to the film corresponding to the flow of 0.9 cc/min TMG and 0.4 cc/min TMA. Likewise, the section with 0 cc/min TMG and 0.8 cc/min TMA would result in an aluminum-rich relative to the film corresponding to the flow of 0.9 cc/min TMG and 0.4 cc/min TMA.

Note that the average flow rates for the TMG and the TMA during seconds 10-110 is the same as for the conventional flow rates illustrated in Table 2. Thus, the average composition of the five-period superlattice would correspond to the composition of the average flows, namely, 0.9 cc/min TMG and 0.4 cc/min TMA. A crystal grower could replace the MOCVD flow conditions of Table 2 with the flow conditions of Table 3 and achieve an inhomogeneous quantum well structure that has the same average composition as the quantum well layers of Table 1 (layers 49 and 53). Table 4, which is presented below, illustrates the epitaxial structure of the inhomogeneous quantum well that is obtained using the gas flow rates described in Table 3.

TABLE 4

| Layer | Composition | Thickness (nm) | Repetition | Comments |
|---|---|---|---|---|
| 1 | $In_{.01}Al_{.14}Ga_{.85}N$ | .4375 | | Inhomogeneous |
| 2 | $In_{.01}Ga_{.99}N$ | .875 | 4 | quantum well, |
| 3 | $In_{.01}Al_{.99}N$ | | | 5.25 nm total |
| 12 | $In_{.01}Al_{.14}Ga_{.85}N$ | .4375 | | |

Figure 7:
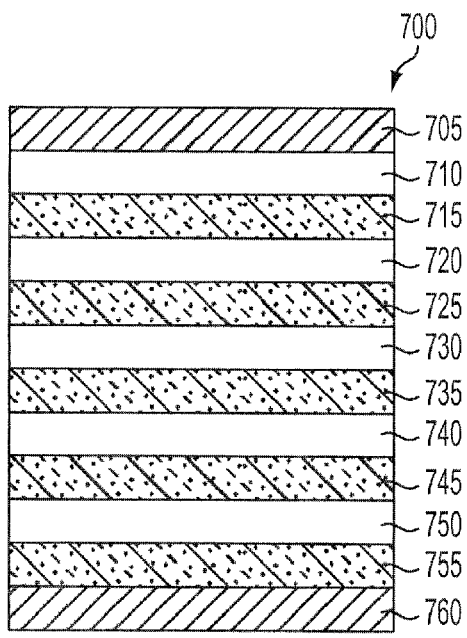
FIG. 7 is a cross-sectional diagram illustrating an embodiment of an imhogeneous superlattice structure.

FIG. 7 is a cross-sectional diagram illustrating an example embodiment of an inhomogeneous superlattice structure. In particular, FIG. 7 illustrates all twelve layers of an inhomogeneous quantum well 700 that is described above in Table 4. FIG. 7 is drawn for illustrative purposes and is not drawn to scale.

Referring to FIG. 7, the cross-hatched layers 705, 760 of the quantum well 700 correspond to layers 1 and 12 in Table 4. The clear layers 710, 720, 730, 740, 750 correspond to layers 2, 4, 6, 8, 10, respectively, of Table 4. The dotted layers 715, 725, 735, 745, 755 of the quantum well 700 correspond to layers 3, 5, 7, 9, 11, respectively, of Table 4. The five-period superlattice structure consisting of layers 710, 715, 720, 725, 730, 735, 740, 745, 750, and 755 is clearly visible in FIG. 7.

Tables 3, 4 and FIG. 7 illustrate a further advantage of example embodiments. The conventional homogeneous quantum well layers (layers 49 and 53) of Table 1 are composed of a relatively thick quaternary alloy, that is, the homogeneous quantum well layer has four principal constituents. According to example embodiments, the conventional quantum well layers can be replaced using an inhomogeneous superlattice structure like the one illustrated in FIG. 7. As shown by layers 2 and 3 of Table 4, the example superlattice structure consists of alternating layers of relatively thin ternary alloys, that is, a layer having three principal constituents. While the inhomogeneous superlattice structure has the same average composition as the conventional homogeneous quantum well layer, it is easier to control the growth of multiple layers of ternary alloys that are relatively thin rather than the growth of a single layer of a quaternary alloy that is relatively thick.

Similarly, according to other example embodiments a conventional homogenous quantum well layer consisting of a ternary alloy could be replaced by an inhomogenous superlattice structure consisting of alternating layers of binary alloys, or alloys having two principal constituents. For example, the ternary alloy InGaN has a tendency to uncontrollably segregate into random clusters of InN or GaN as the concentration of indium increases, which is very undesirable. By replacing a single InGaN layer with multiple alternating layers of InN and GaN that can be precisely controlled, the same average composition can be achieved without the danger of segregation that is inherent in the single homogeneous layer.

Table 5, which is presented below, illustrates the MOCVD gas flow conditions for another five-period superlattice quantum well design according to an example embodiment where only the TMG flow is varied within each period of the superlattice. In this design, the section with 1.2 cc/min TMG and 0.4 cc/min TMA would result in a gallium-rich film relative to the film corresponding to the flow of 0.9 cc/min TMG and 0.4 cc/min TMA. Likewise, the section with 0.6 cc/min TMG and 0.4 cc/min TMA would result in an aluminum-rich film relative to the film correspond to the flow of 0.9 cc/min TMG and 0.4 cc/min TMA.

TABLE 5

| Time (sec) | TMG (cc/min) | TMA (cc/min) | TMI (cc/min) | Repetition |
|---|---|---|---|---|
| 0-10 | 0.9 | 0.4 | 80 | |
| 10-20 | 1.2 | 0.4 | 80 | 4 |
| 20-30 | 0.6 | 0.4 | 80 | |
| 110-120 | 0.9 | 0.4 | 80 | |

The average composition for the five-period superlattice quantum well structure resulting from the gas flow rates of Table 5 remains the same as the average composition for the five-period superlattice quantum well structure resulting from the gas flow rates of Table 3. Table 6, which is presented below, illustrates the epitaxial structure of the inhomogeneous superlattice that is obtained using the gas flow rates described in Table 5.

TABLE 6

| Layer | Composition | Thickness (nm) | Repetition | Comments |
|---|---|---|---|---|
| 1 | $In_{.01}Al_{.14}Ga_{.85}N$ | .4375 | | Inhomogeneous |
| 2 | $In_{.01}Al_{.11}Ga_{.88}N$ | .875 | 4 | quantum well, |
| 3 | $In_{.01}Al_{.17}Ga_{.82}N$ | | | 5.25 nm total |
| 12 | $In_{.01}Al_{.14}Ga_{.85}N$ | .4375 | | |

Figure 3:
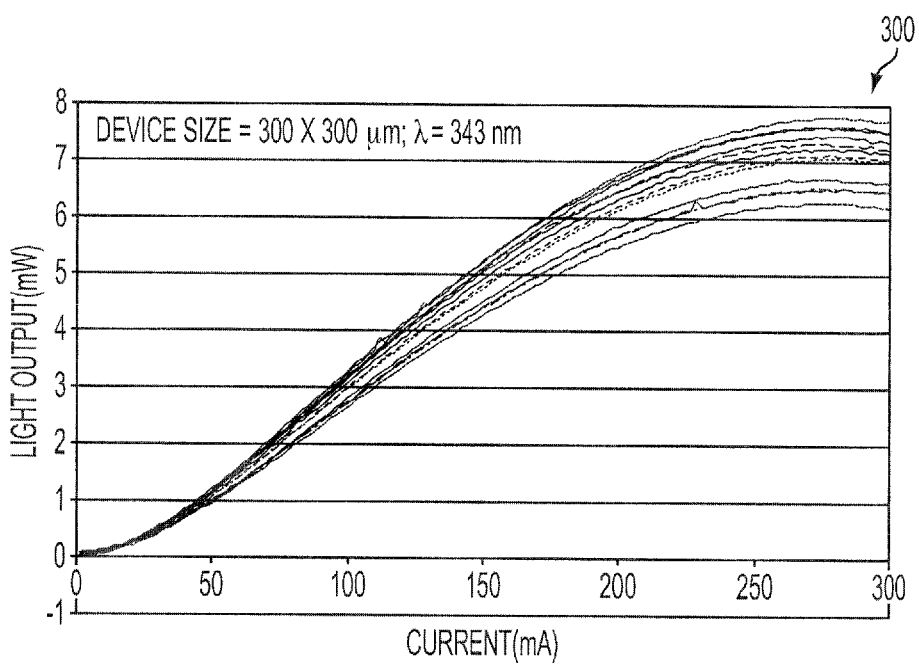
FIG. 3 is a graph illustrating the L-I characteristics of 300 μm×300 μm deep UV LEDs that employ superlattice quantum well active layers in accordance with example embodiments.
Figure 4:
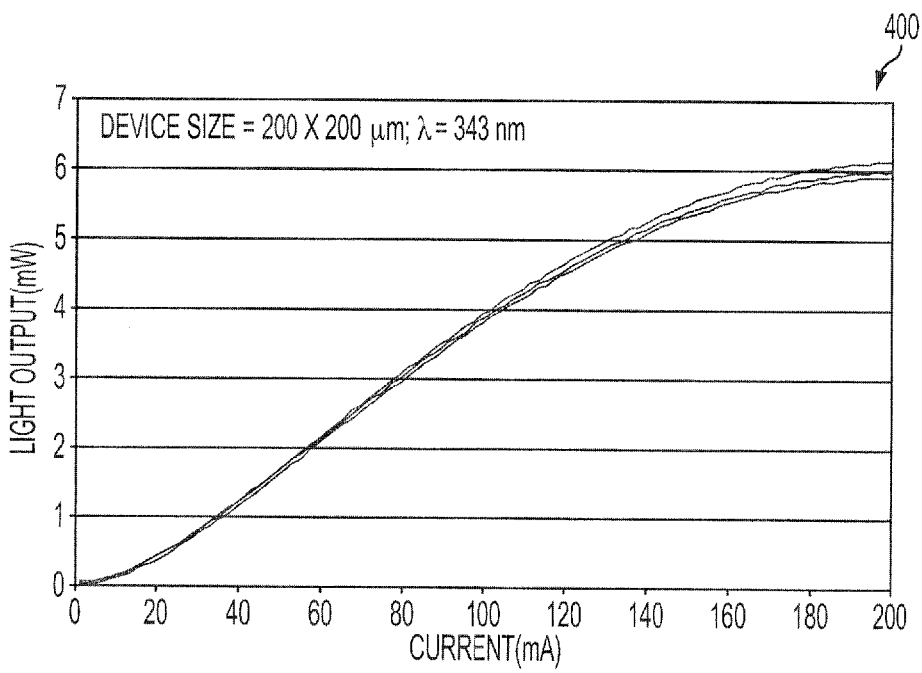
FIG. 4 is a graph illustrating the L-I characteristics of a 200 μm×200 μμm deep UV LEDs that employ superlattice quantum well active layers in accordance with example embodiments.

FIG. 3 is a graph 300 illustrating the L-I characteristics of 300 μm×300 μm deep UV LEDs that employ superlattice quantum well active layers in accordance with example embodiments, while FIG. 4 is a graph 400 illustrating the L-I characteristics of 200 μm×200 μm deep UV LEDs that employ superlattice quantum well active layers in accordance with example embodiments. The LEDs characterized in FIGS. 3 and 4 were fabricated on the same wafer using the superlattice quantum well design illustrated in Tables 5 and 6.

Figure 2:
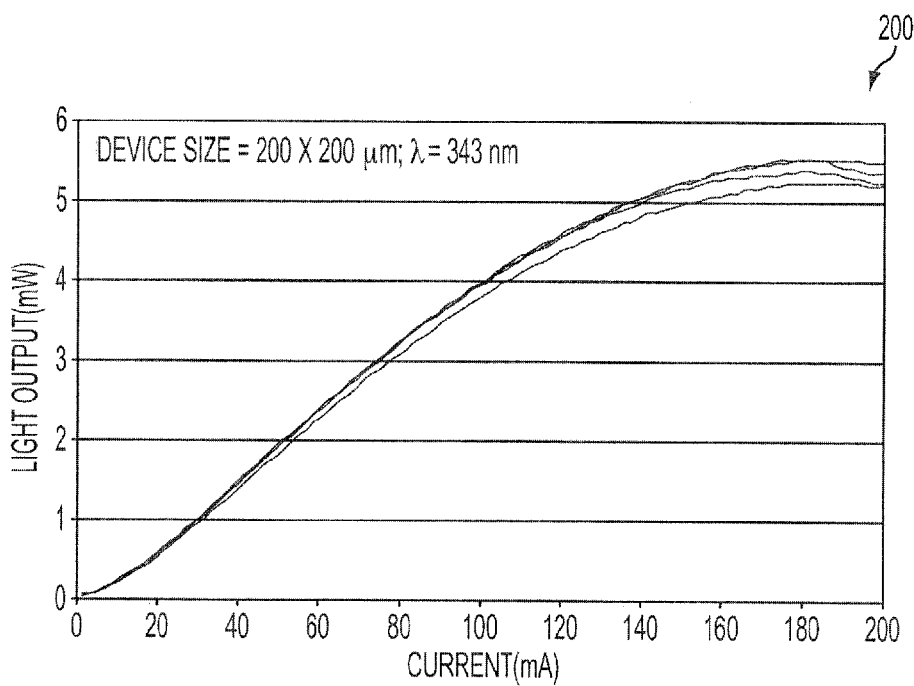
FIG. 2 is a graph illustrating the L-I characteristics of 200 μm×200 μm deep UV LEDs that employ conventional quantum well active layers having uniform material composition.

For comparison with FIGS. 3 and 4, FIG. 1 is a graph 100 illustrating the L-I characteristics of 300 μm×300 μm deep UV LEDs that employ conventional quantum well active layers having uniform material composition, while FIG. 2 is a graph 200 illustrating the L-I characteristics of 200 μm× 200 μm deep UV LEDs that employ conventional quantum well active layers having uniform material composition. Other than the quantum well layers, the epitaxial layers of the LEDs characterized in FIGS. 3 and 4 were identical to the epitaxial layers of the LEDs characterized in FIGS. 1 and 2.

Referring to FIGS. 1, 2, 3, and 4, it can be seen that the peak light output for the LEDs that employ the inhomogeneous superlattice quantum well active layers according to example embodiments is roughly 0.7 mW greater than the LEDs that employ the conventional quantum well active layers having a uniform material composition. The L-I characteristics shown in FIGS. 3 and 4 are excellent results for λ=343 nm.

Figure 5:
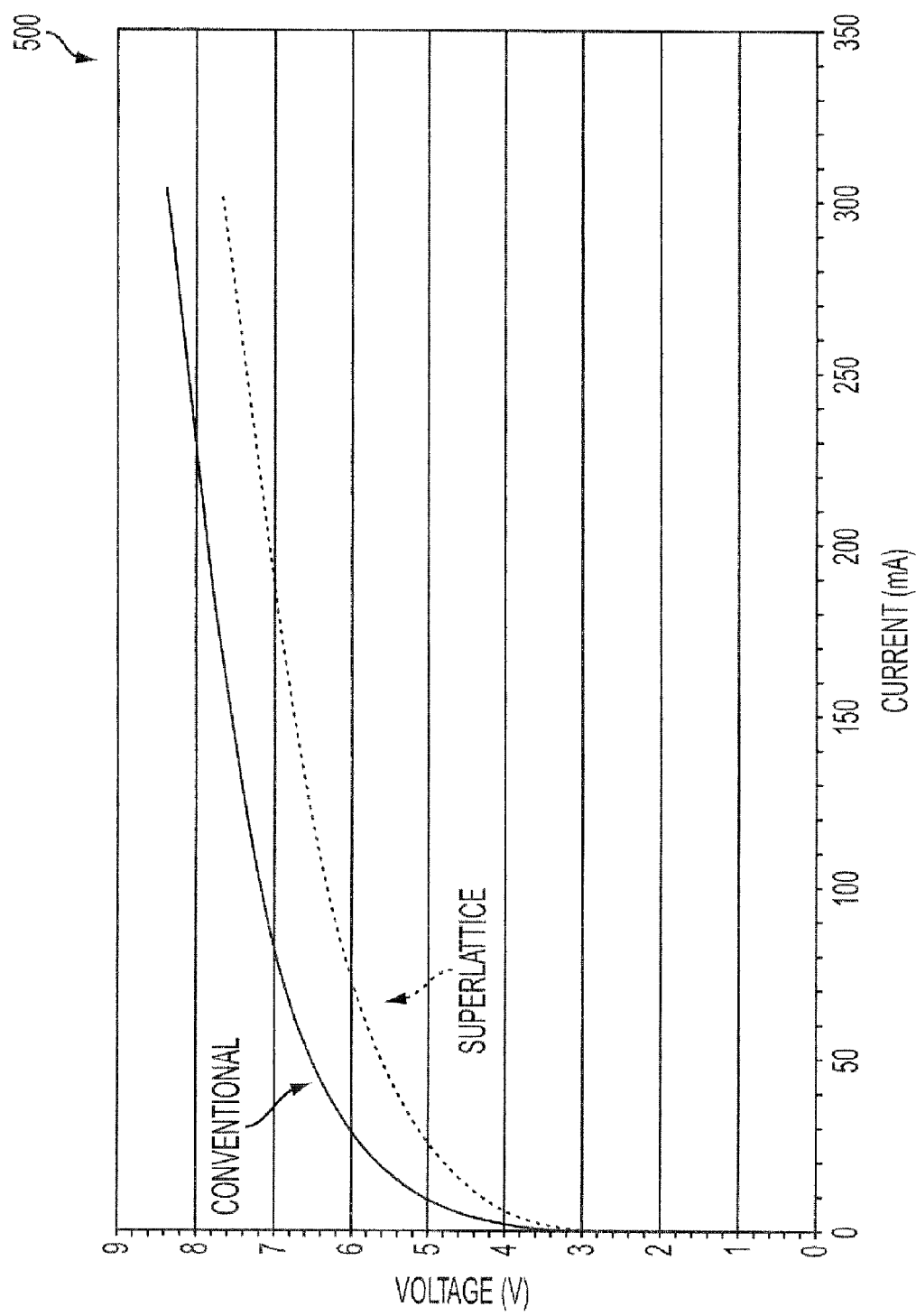
FIG. 5 is a graph that compares the V-I (voltage-current) characteristics of one of the deep UV LEDs characterized in FIG. 3 to the V-I characteristics of one of the deep UV LEDs that is characterized in FIG. 1.

FIG. 5 is a graph 500 that compares the V-I characteristics of one of the deep UV LEDs characterized in FIG. 3 to the V-I characteristics of one of the deep UV LEDs that is characterized in FIG. 1. FIG. 5 illustrates that for a given current, less voltage is needed for the superlattice design than for the conventional design. Evidently, the superlattice quantum well device according to example embodiments performs better than the conventional quantum well device in terms of both power output and lower voltages.

A special case of the superlattice multiple quantum well is the superlattice single quantum well, where a simple single-period superlattice encompasses the entire active region. Another example embodiment would be a superlattice multiple quantum well active region where the barrier layers are constructed of superlattices. The quantum wells within this active region can be conventional quantum wells with homogeneous composition, or they can also be superlattices as already described.

Other inhomogeneous quantum well designs can be employed. For example, variable-period-superlattice quantum wells would be a straightforward extension of the devices described above. In such a design, the periodicity of material fluctuation changes across the quantum well. Additionally, although the discussion thus far has focused on MOCVD growth, MBE may be a growth technique of choice if low-temperature conditions such as those for high indium incorporation are desired.

In Table 3, the gas source flow rates for TMG and TMA are simultaneously switched during superlattice transitions, but this simultaneous transition is not essential. One gas source can be switched first from one flow rate to another before a subsequent flow rate change is made on the second or third gas source. The transition delays between gas sources would produce a smoother, more gradual transition in material composition fluctuations. These transition designs would also apply to embodiments where the material composition changes are affected by changing growth parameters other than source gas flow rates. In the case of MBE or CBE, for example, the growth parameter of choice may be temperature.

It is common to grow nitride-based light emitting devices on c-plane substrates. Unfortunately, this crystal orientation leads to polarization field at the quantum well layers. The built-in electric field causes energy band tilting that hampers carrier recombination. To help counteract the polarization field, Si impurity doping has been used at the barriers in multiple quantum well structures. An extra degree of design flexibility could be achieved by doping the quantum wells without seriously impairing the recombination process. According to example embodiments, a possible technique would be to use superlattice quantum well active layers and to dope only the high bandgap sections of the superlattice. The inventors have demonstrated just such a device having good device performance.

Figure 6:
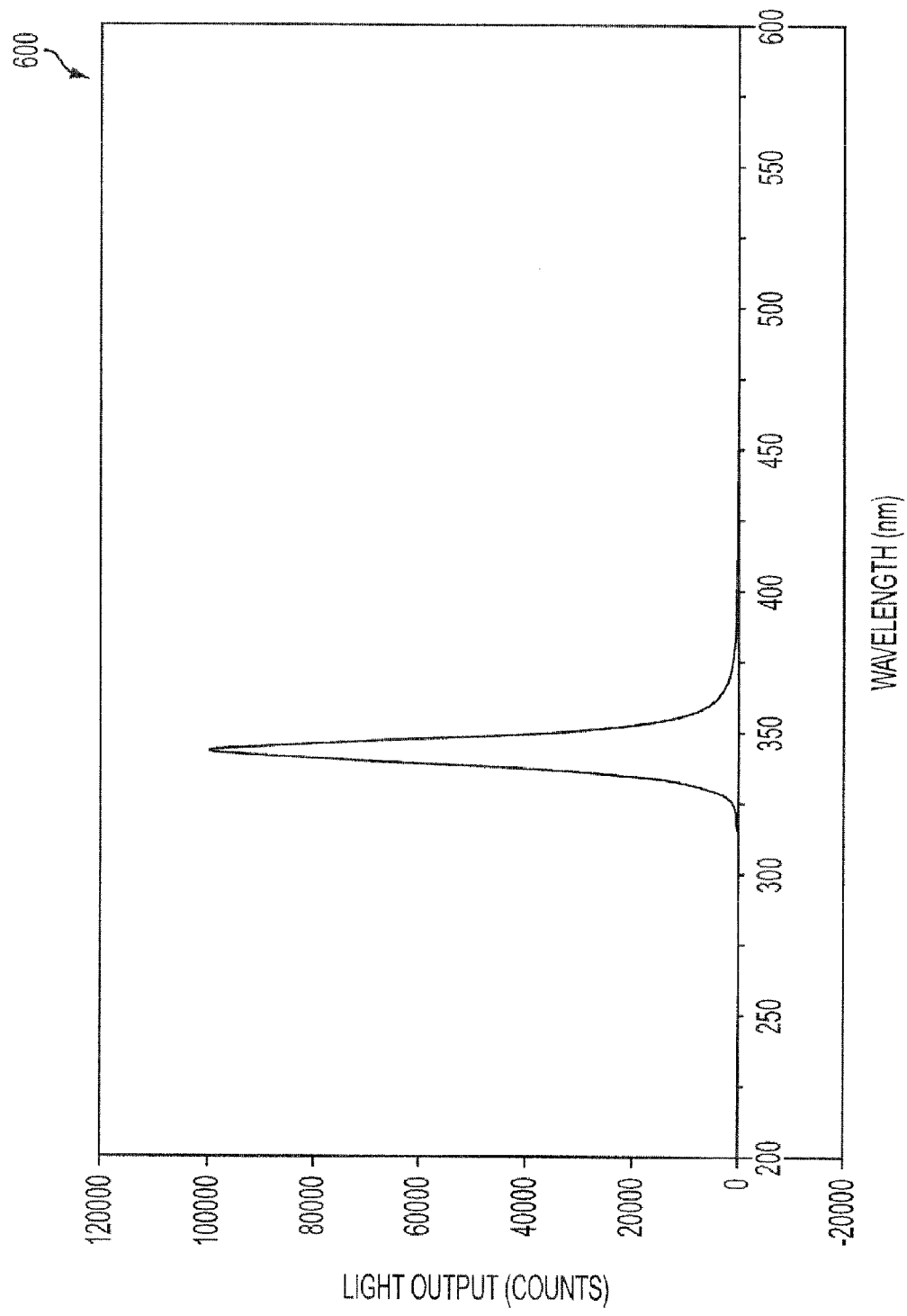
FIG. 6 is a graph that illustrates the spectrum of a LED that employs superlattice quantum wells with Si-doped high bandgap sections in accordance with example embodiments.

FIG. 6 is a graph 600 that illustrates the spectrum of a LED that employs superlattice quantum wells with Si-doped high bandgap sections in accordance with example embodiments. The superlattice structure of the LED characterized in FIG. 6 was obtained using Table 5, with the exception that Si doping was added during the 0.6 cc/min TMG, 0.4 cc/min TMA growth segment for the superlattice. While better-performing devices have been obtained from undoped quantum wells, the result suggests that doped superlattice quantum wells are also a viable alternative.

Figure 8:
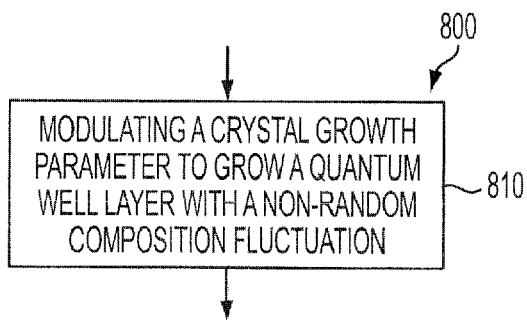
FIG. 8 is a flowchart illustrating a process included in example method embodiments for fabricating a light-emitting device.

FIG. 8 is a flowchart illustrating a process 810 included in a method embodiment 800 for fabricating a light-emitting device. Referring to FIG. 8, the process 810 includes modulating a crystal growth parameter to grow a quantum well layer that is inhomogeneous and that has a non-random composition fluctuation across the quantum well layer. Those of ordinary skill in the art will recognize that process 810 may involve a multitude of repeating sub-processes. For example, for the quantum well 700 having the five-period superlattice structure illustrated in FIG. 7, the same epitaxial layer deposition process is performed five times to form the layers 710, 720, 730, 740, and 750. Likewise, a different epitaxial layer deposition process is performed five times to deposit the layers 715, 725, 735, 745, and 755. Any known technique for forming or depositing an epitaxial layer may be used. For example, MOCVD, MBE, or CBE may be used in different embodiments.

Figure 9:
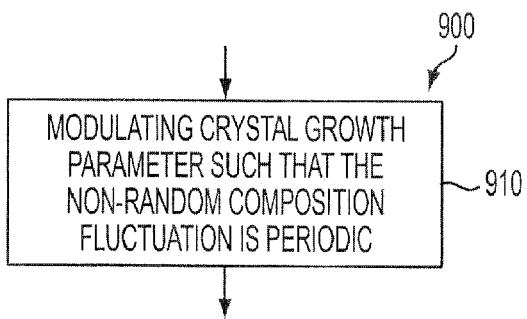
FIG. 9 is a flowchart illustrating an example sub-process included in the process of FIG. 8.

FIG. 9 is a flowchart illustrating an example sub-process 900 that may be included in the process 810 of FIG. 8. Referring to FIG. 9 the sub-process 900 includes modulating the crystal growth parameter such that the composition fluctuation is substantially periodic. For example, Table 3 illustrates that the TMA and TMG source gases in a MOCVD process are periodically turned on and off over a time span of 100 seconds. Those of ordinary skill will recognize and appreciate that the periodic material composition fluctuation of the epitaxial layers that result from the process illustrated in Table 3 does not exhibit a perfectly on/off characteristic (analogous to a step function in an electrical signal), but that the presence of some residual source gases in the process chamber will tend to make the transition between layers of different composition a more gradual one.

It will be appreciated that variations of the above-disclosed and other features and functions, or alternatives thereof, may be desirably combined into many other different systems or applications. Also that various presently unforeseen or unanticipated alternatives, modifications, variations or improvements therein may be subsequently made by those skilled in the art which are also intended to be encompassed by the following claims.

What is claimed is:

1. A light-emitting device comprising:
   a first quantum well; and
   first sub-layers included in the first quantum well, an alloy composition of one layer of the first sub-layers different than an alloy composition of another layer of the first sub-layers, a wavelength of the light emitted by the first quantum well defined by a bandgap of an average composition of the first sub-layers.

2. The light-emitting device of claim 1, wherein the first sub-layers constitute a superlattice that exhibits a periodic composition fluctuation.

3. The light-emitting device of claim 1, further comprising:
   a second quantum well;
   second sub-layers included in the second quantum well, an alloy composition of one layer of the second sub-layers different than an alloy composition of another layer of the second sub-layers, a wavelength of the light emitted by the second quantum well defined by a bandgap of an average composition of the second sub-layers; and
   a barrier layer disposed between the first and second quantum wells.

4. The light-emitting device of claim 3, the barrier layer comprising third sub-layers, an alloy composition of one layer of the third sub-layers different than an alloy composition of another layer of the third sub-layers, an energy offset between the barrier layer and one of the first and second quantum wells defined by a bandgap of an average composition of the third sub-layers.

5. The light-emitting device of claim 2, the first sub-layers comprising alternating layers of different materials.

6. The light-emitting device of claim 5, at least one element in the alternating layers of different materials exhibiting a periodic composition fluctuation across the alternating layers of different materials.

7. The light-emitting device of claim 6, each one of the alternating layers of different materials consisting of a binary alloy.

8. The light-emitting device of claim 7, a first one of the alternating layers selected from a first group consisting of AlN, InN, and GaN, a second one of the alternating layers selected from a second group consisting of the members of the first group that were not selected for the first one of the alternating layers.

9. The light-emitting device of claim 6, each one of the alternating layers of different material consisting of a ternary alloy.

10. The light-emitting device of claim 1, wherein at least one layer of the first sub-layers is doped with an impurity.

11. The light-emitting device of claim 10, the impurity selected from the group consisting of Si and Mg.

12. The light-emitting device of claim 1, wherein the wavelength of the light emitted by the first quantum well is red-shifted relative to the bandgap of the average composition of the first sub-layers.

13. A light emitting device comprising:
barrier layers; and
quantum well layers separated by and disposed between the barrier layers, the quantum well layers exhibiting a controlled composition fluctuation across each of the quantum well layers, the quantum well layers forming a single quantum well.

14. The light emitting device of claim 13, the quantum well layers structured to achieve peak emission for a wavelength in a deep UV range.

15. The light emitting device of claim 13, the quantum well layers structured to achieve peak emission for a green wavelength.

16. The light emitting device of claim 13, the quantum well layers exhibiting a periodic composition fluctuation across each of the quantum well layers.

17. The light emitting device of claim 16, the quantum well layers comprising:
a first layer having a first composition;
a second layer having a second composition different from the first composition; and
a third layer having the first composition.

18. A light-emitting device comprising:
a first quantum well;
a second quantum well disposed below the first quantum well; and
a barrier layer disposed between the first and second quantum wells, the barrier layer comprising first sub-layers, an alloy composition of one layer of the first sub-layers different than an alloy composition of another layer of the first sub-layers with regard to one element of the alloy composition, an energy offset between the barrier layer and one of the first and second quantum wells defined by a bandgap of an average composition of the first sub-layers.

19. A light emitting device comprising:
barrier layers; and
quantum well layers separated by and disposed between the barrier layers, the quantum well layers exhibiting a controlled composition fluctuation across each of the quantum well layers, the quantum well layers exhibiting a periodic composition fluctuation across each of the quantum well layers, and the quantum well layers comprising:
a first layer having a first composition;
a second layer having a second composition different from the first composition; and
a third layer having the first composition.

* * * * *